US012564914B2

(12) United States Patent
Roh et al.

(10) Patent No.: US 12,564,914 B2
(45) Date of Patent: Mar. 3, 2026

(54) GRINDING APPARATUS AND METHOD FOR MANUFACTURING SEMICONDUCTOR DEVICE USING THE SAME

(71) Applicant: Samsung Electronics Co., Ltd., Suwon-si (KR)

(72) Inventors: Junghyun Roh, Suwon-si (KR); Jongguw Kim, Suwon-si (KR); Wangsun Lim, Suwon-si (KR); Manhee Han, Suwon-si (KR); Jaeyoung Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 539 days.

(21) Appl. No.: 17/977,018

(22) Filed: Oct. 31, 2022

(65) Prior Publication Data

US 2023/0339071 A1 Oct. 26, 2023

(30) Foreign Application Priority Data

Apr. 26, 2022 (KR) ........................ 10-2022-0051603

(51) Int. Cl.
*B24B 53/00* (2006.01)
*B24B 53/017* (2012.01)
*H01L 21/304* (2006.01)

(52) U.S. Cl.
CPC .......... *B24B 53/005* (2013.01); *B24B 53/017* (2013.01); *H01L 21/304* (2013.01)

(58) Field of Classification Search
CPC ..... B24B 53/017; B24B 53/005; B24B 53/02; B24B 53/12; B24B 47/20; B24B 47/00;
(Continued)

(56) References Cited

U.S. PATENT DOCUMENTS 6,340,326 B1 1/2002 Kistler et al.
6,960,114 B2 * 11/2005 Lee ....................... B24B 53/017
451/72

(Continued)

FOREIGN PATENT DOCUMENTS

JP 2011-189456 A 9/2011
JP 6166974 B2 * 7/2017 ............. B24B 53/00
(Continued)

OTHER PUBLICATIONS

Espacenet Translate KR-20160051219; Conditioner of Chemical Mechanical Polishing Apparatus Capable of Roughness Deviation on Polishing Pad Surface; Che, Hui Seong; May 11, 2016 (Year: 2016).*
(Continued)

*Primary Examiner* — Brian D Keller
*Assistant Examiner* — Sidney D Full
(74) *Attorney, Agent, or Firm* — Harness, Dickey & Pierce, P.L.C.

(57) ABSTRACT

A grinding apparatus and a method for manufacturing a semiconductor device using the same are provided. A grinding apparatus includes a chuck unit configured to receive a substrate, a grinding unit on a part of the chuck unit and configured to grind the substrate, and a dressing unit under a part of the grinding unit adjacent to the chuck unit and including a dressing board configured to dress the grinding unit and magnets under the dressing board.

14 Claims, 5 Drawing Sheets

(58) Field of Classification Search
CPC ....... B24B 7/248; B24B 7/228; H01L 21/304;
H01F 7/0236
USPC ............................................ 451/56, 72, 443
See application file for complete search history.

(56) References Cited

U.S. PATENT DOCUMENTS

| | | | |
|---|---|---|---|
| 6,997,778 B2 | 2/2006 | Ono et al. | |
| 2002/0033230 A1 * | 3/2002 | Hayashi ................ | B24B 41/042 |
| | | | 257/629 |

FOREIGN PATENT DOCUMENTS

| | | | |
|---|---|---|---|
| JP | 6734667 B2 | | 8/2020 |
| JP | 6887864 B2 | | 6/2021 |
| KR | 10-0780977 B1 | | 11/2007 |
| KR | 20160051219 A | * | 5/2016 |
| KR | 10-2221749 B1 | | 2/2021 |

OTHER PUBLICATIONS

Espacenet Translate JP6166974; Grinding Equipment; Godika, Y;
Jul. 18, 2017 (Year: 2017).*

* cited by examiner

GRINDING APPARATUS AND METHOD FOR MANUFACTURING SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application No. 10-2022-0051603, filed on Apr. 26, 2022, in the Korean Intellectual Property Office, the entire contents of which are hereby incorporated by reference.

BACKGROUND

The inventive concepts relate to apparatuses for manufacturing a semiconductor device and methods for manufacturing the same, and more particularly, to grinding apparatuses and methods for manufacturing semiconductor devices using the same.

Recently, a portable electronic device such as a mobile phone is required to have high integration and thinness, simultaneously. A semiconductor device, which is a key component of the portable electronic device, may be thinner mainly through a back-lap process and/or a back grinding process of a substrate. The back-lap process may be a process of grinding a back surface of the substrate, that is, the back surface on which a pattern is not formed. A final thickness of the substrate may be determined depending on a type of semiconductor device or a customer's demand.

SUMMARY

Some example embodiments of the inventive concepts provide a grinding device and/or grinding apparatus capable of performing a method of manufacturing a semiconductor device while reducing, minimizing, or preventing damage, to the grinding device and/or grinding apparatus or to a semiconductor device manufactured using the grinding device and/or grinding apparatus, due to reducing, minimizing, or preventing collision between a grinding unit and a dressing unit of the grinding device.

Some example embodiments of the inventive concepts provide a grinding apparatus capable of precisely controlling dressing efficiency of a grinding tip.

According to some example embodiments of the inventive concepts, a grinding apparatus may include a chuck unit that receives a substrate, a grinding unit that is provided on a part of the chuck unit and grinds the substrate, and a dressing unit that is provided under a part of the grinding unit adjacent to the chuck unit and dresses the grinding unit. The dressing unit may include driving parts, a dressing board that is provided on the driving parts and dresses the grinding unit, and magnets between the dressing board and the driving parts to float the dressing board from the driving parts using a repulsive force of a magnetic field.

According to some example embodiments of the inventive concepts, a grinding apparatus may include a chuck unit including a chuck table receiving a substrate, a grinding unit including a grinding wheel on the chuck table and grinding tips between the grinding wheel and the chuck table, and a dressing unit adjacent to the chuck table and dressing the grinding tips. The dressing unit may include an external guiding part, driving parts under the external guiding part, a dressing board on the driving parts to dress the grinding tips, and magnets including a lower magnet in the external guiding part between the dressing board and the driving parts and an upper magnet in the external guiding part between the lower magnet and the dressing board.

According to some example embodiments of the inventive concepts, a method of manufacturing a semiconductor device may include preparing a substrate, grinding the substrate using a grinding apparatus, and dressing grinding tips of the grinding apparatus using a dressing unit of the grinding apparatus. The dressing unit may include driving parts, a dressing board on the driving parts and for dressing the grinding tips, and magnets between the dressing board and the driving parts to float the dressing board from the driving parts using a repulsive force of a magnetic field.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
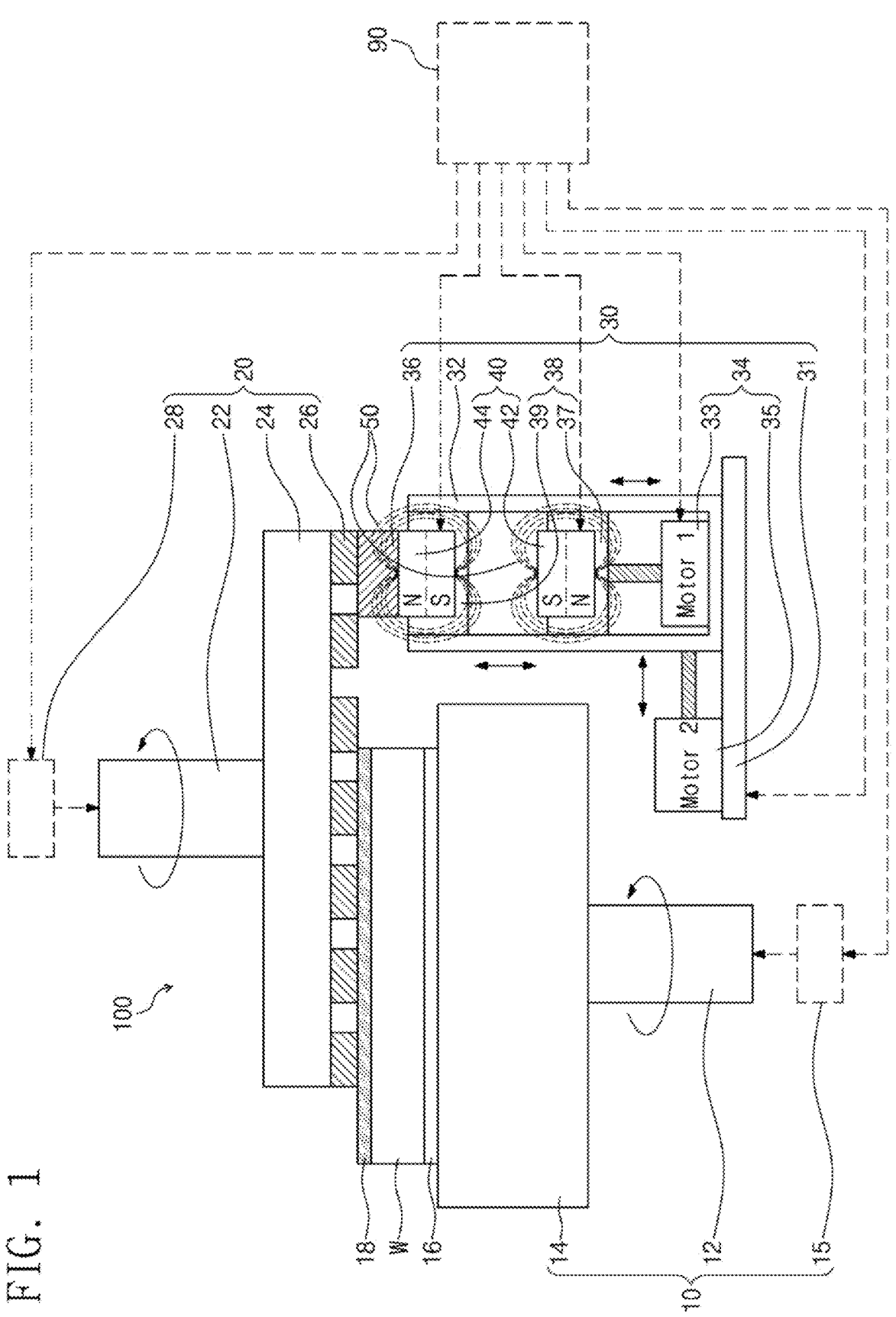
FIG. 1 is a cross-sectional view illustrating an example of a grinding apparatus according to some example embodiments of the inventive concepts.

Hereinafter, some example embodiments of the present inventive concepts will be described with reference to the accompanying drawings.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular,"

or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.).

FIG. 1 illustrates an example of a grinding apparatus 100 according to some example embodiments of the inventive concepts.

Referring to FIG. 1, the grinding apparatus 100 of the inventive concepts may be a back-lap device. According to some example embodiments, the grinding apparatus 100 may include a chuck unit 10, a grinding unit 20, and a dressing unit 30.

The chuck unit 10 may receive a substrate W such that the chuck unit 10 structurally supports the substrate W (e.g., supports the load of the substrate W) on an upper surface of the chuck unit 10, as shown. The chuck unit 10 may rotate the substrate W in an azimuthal direction. The chuck unit 10 may be referred to interchangeably as a chuck device, a chuck assembly, or the like. According to some example embodiments, the chuck unit 10 may include a chuck shaft 12 and a chuck table 14. In some example embodiments, the chuck unit 10 may include a driver 15, which may be a motor, an actuator, or the like, such as a servomotor, servoactuator, a linear actuator, or the like, which may be coupled to the chuck shaft 12 and may be configured to cause the chuck unit 10 to rotate the substrate W in the azimuthal direction based on the driver 15 causing at least the chuck shaft 12 to rotate so as to cause the chuck table 14 to rotate.

The chuck shaft 12 may be provided below the chuck table 14. The chuck shaft 12 may rotate the chuck table 14

(e.g., based on being caused to rotate by the driver 15) and the substrate W on the chuck table 14 in an azimuth direction.

The chuck table 14 may be provided on the chuck shaft 12. The chuck table 14 may receive the substrate W. Although not shown, the chuck table 14 may have the same shape as the substrate W. The chuck table 14 may have a circular shape in a plan view. The chuck table 14 may fix the substrate W by a physical manner (e.g., vacuum chucking, mechanical clamping, or electrostatic force chucking).

The substrate W may include a silicon wafer. The substrate W may have a pattern layer 16 and a rear thin film layer 18. According to some example embodiments, the pattern layer 16 may be a front thin film layer. The pattern layer 16 may be formed on an upper surface of the substrate W. For example, the pattern layer 16 may include a memory device, a thin film transistor, a resistor, a capacitor, a metal wiring, and an interlayer insulating layer. The rear thin film layer 18 may be formed on a lower surface of the substrate W. The rear thin film layer 18 may include silicon oxide or silicon nitride.

The grinding unit 20 may be provided on the chuck table 14. The grinding unit 20 may be referred to interchangeably as a grinding device, a grinding assembly, or the like. The grinding unit 20 may grind the rear thin film layer 18 of the substrate W. According to some example embodiments, the grinding unit 20 may include a grinding shaft 22, a grinding wheel 24, and grinding tips 26.

The grinding shaft 22 may be provided on the chuck table 14 and the grinding wheel 24. The grinding shaft 22 may be arranged in the same direction as the chuck shaft 12. The grinding shaft 22 may be connected to a center of the grinding wheel 24. The grinding shaft 22 may rotate the grinding wheel 24. In some example embodiments, the grinding unit 20 may include a driver 28, which may be a motor, an actuator, or the like, such as a servomotor, servoactuator, a linear actuator, or the like, which may be coupled to the grinding shaft 22 and may be configured to cause the grinding wheel 24 to rotate (e.g., in the azimuthal direction) based on the driver 28 causing at least the grinding shaft 22 to rotate.

The grinding wheel 24 may be provided below the grinding shaft 22. The grinding wheel 24 may be provided on one side of the chuck table 14. As shown in at least FIG. 1, the grinding wheel 24 may be parallel to the substrate W and the chuck table 14, for example such that a lower surface of the grinding wheel extends in parallel with an upper surface of the chuck table 14 upon which the substrate W may be supported and in contact. In some example embodiments, the grinding wheel 24 may be inclined with respect to the substrate W and the chuck table 14, but the inventive concepts are not limited thereto. The grinding wheel 24 may be rotated in an azimuth (e.g., azimuthal) direction by a grinding shaft 22. The grinding wheel 24 may rotate the grinding tips 26 (e.g., based on the driver 28 causing the grinding shaft 22 to rotate to further cause the grinding wheel 24 to rotate) to grind the rear thin film layer 18 of the substrate W, such that the grinding unit 20 is configured to grind the substrate W, for example based on moving contact between one or more of the grinding tips 26 and the rear thin film layer 18 of the substrate W.

The grinding tips 26 may be provided on a lower surface of the grinding wheel 24. The grinding tips 26 may be configured to be in contact with the rear thin film layer 18 of the substrate W to grind the rear thin film layer 18, for example based on rotation of the grinding wheel 24 due to being driven by the driver 28. For example, each of the grinding tips 26 may include a diamond block. Although not shown, each of the grinding tips 26 may include diamond grains and an adhesive for fixing the diamond grains, and the inventive concepts are not limited thereto.

Figure 2:
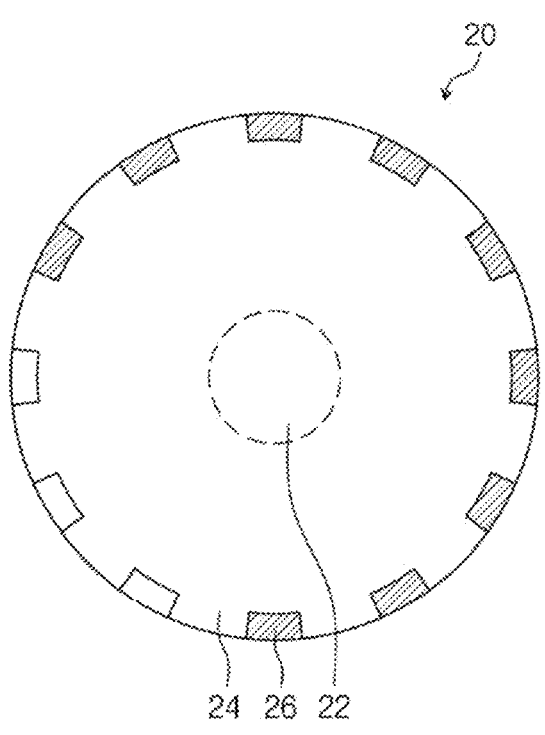
FIG. 2 is a plan view illustrating an example of a grinding unit of FIG. 1 according to some example embodiments of the inventive concepts.

FIG. 2 illustrates an example of the grinding unit 20 of FIG. 1 according to some example embodiments of the inventive concepts.

Referring to FIGS. 1 and 2, the grinding tips 26 of the grinding unit 20 may be provided on an edge of the grinding wheel 24 outside the grinding shaft 22 (e.g., outside a diameter of the grinding shaft 22 such that the grinding shaft 22 does not overlap the grinding tips 26 in an axial direction extending parallel to the central longitudinal axis of the grinding shaft 22 and/or such that the grinding tips 26 are radially offset from the grinding shaft 22 on the grinding wheel 24).

The grinding shaft 22 may be provided at the center of the grinding wheel 24, for example such that the central longitudinal axis of the grinding shaft 22 is coaxial with the central longitudinal axis of the grinding wheel 24.

The grinding wheel 24 may have a circular shape in a plan view. The grinding wheel 24 may include an aluminum alloy wheel, but the inventive concepts are not limited thereto.

The grinding tips 26 may be arranged in a circle shape along the edge of the grinding wheel 24. Each of the grinding tips 26 may have a rectangular or trapezoidal shape in a plan view.

Referring back to FIG. 1, the dressing unit 30 may be provided under a part (e.g., under one edge) of the grinding unit 20, for example such that at least a portion of the dressing unit 30 may overlap at least a portion of the grinding unit 20 in an axial direction extending in parallel with the central longitudinal axis of the grinding wheel 24 and/or the grinding shaft 22. The dressing unit 30 may be referred to interchangeably as a dressing device, a dressing assembly, or the like. The dressing unit 30 may be configured to be in contact with one or more of the grinding tips 26 to dress the one or more grinding tips 26. It will be understood that "dressing" the one or more grinding tips 26 may include removing material from the grinding tips 26, including for example clogs, dulled grinding material (e.g., dulled diamond grains) of the grinding tips 26, excess adhesive material (e.g., excess adhesive material for adhering diamond grains to the grinding tips 26, or the like and which may newly expose previously-obscured grinding material (e.g., un-dulled diamond grains) of the grinding tips 26, which may restore sharpness and thus grinding performance of the grinding tips 26. According to some example embodiments, the dressing unit 30 may include a unit arm 31, an external guiding part 32, driving parts 34 (also referred to herein as drivers), a dressing board 36, internal guiding parts 38, and magnets 40.

The unit arm 31 may be provided adjacent to the chuck unit 10 (e.g., adjacent in a direction extending perpendicular to a longitudinal axis of the chuck shaft 12 and/or the chuck table 14). The unit arm 31 may be provided below the external guiding part 32, the driving parts 34, the dressing board 36, the internal guiding parts 38, and the magnets 40 to support them. The unit arm 31 may move the external guiding part 32, the driving parts 34, the dressing board 36, the internal guiding parts 38, and the magnets 40 in a horizontal direction (e.g., a direction extending perpendicular to a longitudinal axis of the chuck shaft 12 and/or the chuck table 14 and/or a direction extending parallel to the upper surface of the chuck table 14) and/or vertical direction (e.g., a direction extending parallel to a longitudinal axis of the chuck shaft 12 and/or the chuck table 14, and/or a direction extending parallel to a longitudinal axis of the grinding shaft 22 and/or the grinding wheel 24).

The external guiding part 32 may be provided on one side of the unit arm 31. According to some example embodiments, the external guiding part 32 may be a structure, such as a beam or plate, which may have a U-shape in a vertical view. The external guiding part 32 may receive some of the driving parts 34, the internal guiding parts 38, and the magnets 40 (e.g., into an internal space at least partially defined by one or more inner surfaces of the external guiding part, as shown in at least FIG. 1). The external guiding part 32 may protect some of the driving parts 34, the internal guiding parts 38, and the magnets 40.

The driving parts 34 may be provided inside and outside the external guiding part 32 (e.g., inside and outside the internal space of the external guiding part 32 as shown in at least FIG. 1). One of the driving parts 34 may move the external guiding part 32 in a horizontal direction. The other one of the driving parts 34 may move the dressing board 36, the internal guiding parts 38, and the magnets 40 in a vertical direction. For example, each of the driving parts 34 may include a motor, driver, actuator, or the like (e.g., a servo-motor, a servoactuator, a linear actuator, or the like), but the inventive concepts are not limited thereto. According to some example embodiments, the driving parts 34 may include a vertical driving part 33 and a horizontal driving part 35.

The vertical driving part 33 may be provided in the external guiding part 32. The vertical driving part 33 may be provided under the dressing board 36, the internal guiding parts 38, and the magnets 40. The vertical driving part 33 may move the dressing board 36, the internal guiding parts 38, and the magnets 40 in a vertical direction. The vertical driving part 33 may be a macro adjusting portion that largely control frictional force and/or compression force between the dressing board 36 and the grinding tips 26. The vertical driving part 33 may control the frictional force and/or compression force between the dressing board 36 and the grinding tips 26 by controlling a distance between grinding tips 26 and the dressing board 36.

The horizontal driving part 35 may be provided on the other side of the unit arm 31 (e.g., an opposite side of the unit arm 31 in relation to the external guiding part 32 and/or the vertical driving part 33). The horizontal driving part 35 may be disposed outside the external guiding part 32. The horizontal driving part 35 may be connected to one side of the external guiding part 32. The horizontal driving part 35 may move the external guiding part 32 in a horizontal direction.

The dressing board 36 may be provided on the external guiding part 32, the internal guiding parts 38, and the magnets 40. The dressing board 36 may be in contact with and may dress the grinding tips 26. According to some example embodiments, the dressing board 36 may include an abrasive tip configured to abrade a portion of one or more grinding tips 26 in contact with the abrasive tip to thus "dress" the one or more grinding tips 26. For example, the dressing board 36 may include a wool or nonwoven fabric. In some example embodiments, the dressing board 36 may include a polymer compound, but the inventive concepts are not limited thereto.

The internal guiding parts 38 may be provided in the external guiding part 32. As shown in at least FIG. 1, the internal guiding parts 38 may be provided between an inner sidewall (e.g., inner surface) of the external guiding part 32 and outer sidewalls (e.g., outer surfaces) of the magnets 40. The internal guiding parts 38 may be configured to prevent, reduce, minimize, and/or limit horizontal movement of the magnets 40 within the external guiding part 32. For example, each of the internal guiding parts 38 may have a U-or II-shaped cross-section in a vertical view. Each of the internal guiding parts 38 may include a non-ferrous metal tube, a plastic tube, or a rubber tube, but the inventive concepts are not limited thereto. According to some example embodiments, the internal guiding parts 38 may include a lower guiding part 37 and an upper guiding part 39.

The lower guiding part 37 may be provided between the vertical driving part 33 and the upper guiding part 39. The lower guiding part 37 may be provided between the inner sidewall of the external guiding part 32 and the outer sidewall of one of the magnets 40. The lower guiding part 37 may be coupled and/or connected to the outer sidewall of one of the magnets 40. The lower guiding part 37 may be coupled to the outer sidewall of one of the magnets 40. The lower guiding part 37 may be sealed between one of the magnets 40 and the external guiding part 32. The lower guiding part 37 may be configured to prevent, reduce, minimize, and/or limit the horizontal movement of one of the magnets 40.

The upper guiding part 39 may be provided between the lower guiding part 37 and the dressing board 36. The upper guiding part 39 may be provided between the inner sidewall of the external guiding part 32 and the outer sidewall of the other one of the magnets 40. The upper guiding part 39 may be coupled to the outer sidewall of the other one of the magnets 40. The upper guiding part 39 may be sealed between the other one of the magnets 40 and the external guiding part 32. The upper guiding part 39 may be configured to prevent, reduce, minimize, and/or limit the horizontal movement of the other one of the magnets 40.

The magnets 40 may be provided in each of the internal guiding parts 38. The magnets 40 may separate the vertical driving part 33 and the dressing board 36 from each other by using a repulsive force of one or more magnetic fields 50, which may include separate, respective magnetic fields generated by separate, respective magnets 40. For example, the magnets 40 may be configured to generate one or more magnetic fields 50 to separate (e.g., to float) the vertical driving part 33 and the dressing board 36 from each other by using a repulsive force of the one or more magnetic fields 50. According to some example embodiments, the magnets 40 may include a lower magnet 42 and an upper magnet 44 and which may generate separate, respective magnetic fields 50 which may interact with each other to separate (e.g., to float) the vertical driving part 33 and the dressing board 36 from each other by using a repulsive force generated based on the interaction of the separate, respective magnetic fields 50.

The lower magnet 42 may be disposed between the vertical driving part 33 and the upper magnet 44. The lower magnet 42 may be provided in the lower guiding part 37. The lower magnet 42 may float the upper magnet 44 using the repulsive force of the magnetic field 50. For example, the lower magnet 42 may be configured to generate one or more magnetic fields 50 to separate (e.g., to float) the upper magnet 44 from the lower magnet by using a repulsive force of the one or more magnetic fields 50 (e.g., based on the interaction of a magnetic field 50 generated by the lower magnet 42 with a magnetic field 50 generated by the upper magnet 44). The lower magnet 42 may include an electromagnet. For example, the lower magnet 42 may include a solenoid, but the inventive concepts are not limited thereto.

The upper magnet 44 may be disposed between the lower magnet 42 and the dressing board 36. The upper magnet 44 may be provided in the upper guiding part 39. The upper magnet 44 may be floated in the air without being in contact with the lower magnet 42 by the repulsive force of the magnetic field 50. For example, the upper magnet 44 may be configured to generate one or more magnetic fields 50 to configure the upper magnet 44 to be separated (e.g., to be floated) from the lower magnet by using a repulsive force of the one or more magnetic fields 50 (e.g., based on the interaction of a magnetic field 50 generated by the lower magnet 42 with a magnetic field 50 generated by the upper magnet 44). The upper magnet 44 may include a bar-shaped permanent magnet.

The lower magnet 42 and the upper magnet 44 may be arranged such that the same polarities are close to each other in a vertical view. When the lower magnet 42 has an N pole and an S pole above the N pole, the upper magnet 44 may have an N pole and an S pole below the N pole. The lower magnet 42 and the upper magnet 44 may have a repulsive force induced by the S poles facing each other. When the lower magnet 42 has an S pole and an N pole above the S pole, the upper magnet 44 may have an S pole and an N pole below the S pole. The lower magnet 42 and the upper magnet 44 may have a repulsive force induced by the N poles facing each other. When the grinding wheel 24 of the grinding unit 20 and the dressing board 36 collide, a distance between the lower magnet 42 and the upper magnet 44 (e.g., in the vertical direction as shown in FIG. 1) may be reduced and broken damage of the dressing board 36 and the grinding wheel 24 may be prevented or minimized. That is, the lower magnet 42 and the upper magnet 44 may use a repulsive force therebetween to reduce, minimize, or prevent the broken damage of the dressing board 36 and the grinding wheel 24 due to the collision between the dressing board 36 and the grinding wheel 24, thereby improving performance and/or reliability of the grinding apparatus to providing grinding of the substrate W and thus to enable manufacturing of a semiconductor device based on grinding the substrate W.

The lower magnet 42 may adjust a magnitude of the repulsive force with the upper magnet 44 using an external power voltage. The lower magnet 42 may be a micro adjusting portion that precisely and/or accurately adjusts frictional force and/or compression force between the dressing board 36 and the grinding tips 26. The lower magnet 42 may precisely adjust the frictional force and/or compression force between the dressing board 36 and the grinding tips 26 by controlling the distance from the upper magnet 44. Dressing efficiency of the grinding tips 26 may be increased, thereby improving grinding performance and/or grinding efficiency of the grinding apparatus 100 with regard to grinding the substrate W.

Accordingly, the grinding apparatus 100 of the inventive concepts may use the dressing unit 30 including the dressing board 36 that is separated from the driving parts 34 by the repulsive force of the magnets 40, and thus the dressing efficiency of the dressing of the grinding tips 26 may increase, thereby improving the grinding performance and/or reliability of the grinding apparatus 100 with regard to grinding the substrate W.

Still referring to FIG. 1, the grinding apparatus 100 may include a controller 90 which may be communicatively and/or electrically coupled to various elements of the grinding apparatus 100, for example one or more of the chuck unit 10 (e.g., via being communicatively and/or electrically coupled to the driver 15), the grinding unit 20 (e.g., via being communicatively and/or electrically coupled to the driver 28), one or more of the driving parts 34, and/or one or more of the magnets 40 (e.g., where one or more of the magnets 40, such as the lower magnet 42, is an electromagnet). The controller 90 may be configured to control and/or operate the one or more elements of the grinding apparatus 100 to which the controller is communicatively and/or electrically coupled (e.g., via a wired or wireless connection) to cause the grinding apparatus 100 to operate to perform one or more (e.g., any) of the operations of manufacturing a semiconductor device that include preparing a substrate W, grinding the substrate W using the grinding apparatus 100, and/or dressing grinding tips of the grinding apparatus 100 using the dressing unit 30 thereof. The controller 90 may control and/or operate the one or more elements of the grinding apparatus 100 based on generating one or more control signals and transmitting the one or more control signals to the one or more elements of the grinding apparatus 100 to cause the one or more elements, or the grinding apparatus 100 as a whole, to perform an operation (e.g., rotate, cause horizontal and/or vertical movement, generate a magnetic field, etc.). The controller 90 may control and/or operate the one or more elements of the grinding apparatus 100 based on controlling a supply of electrical power to the one or more elements of the grinding apparatus 100 (e.g., initiating, adjusting a magnitude, and/or inhibiting the supply of electrical power) to cause the one or more elements, or the grinding apparatus 100 as a whole, to perform one or more operations (e.g., rotate, cause horizontal and/or vertical movement, generate a magnetic field, etc.).

The controller 90 may include, may be included in, and/or may be implemented by one or more instances of processing circuitry such as hardware including logic circuits; a hardware/software combination such as a processor executing software; or a combination thereof. For example, the controller 90 may include and/or may be implemented by processing circuitry that may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by the controller 90, including causing the grinding apparatus 100 to perform one or more (e.g., any or all) operations of any of the methods according to any of the example embodiments.

Figure 3:
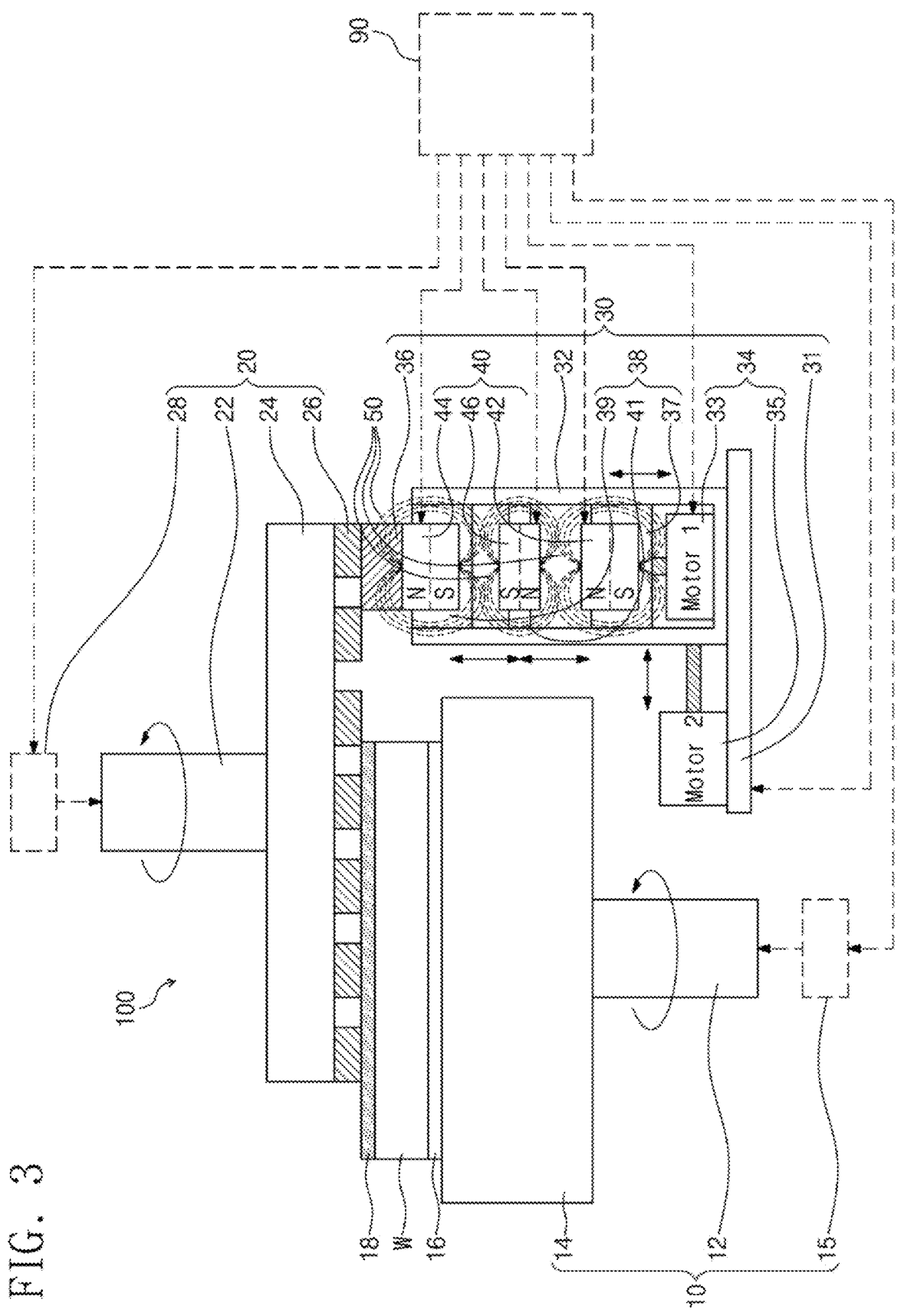
FIG. 3 is a cross-sectional view illustrating an example of a grinding apparatus according to some example embodiments of the inventive concepts.

FIG. 3 is a cross-sectional view illustrating an example of a grinding apparatus 100 according to some example embodiments of the inventive concepts.

Referring to FIG. 3, the magnets 40 of the dressing unit 30 of the grinding apparatus 100 may further include a middle magnet 46.

The middle magnet 46 may be provided between the lower magnet 42 and the upper magnet 44. The middle magnet 46 may float on the lower magnet 42 by the repulsive force of the magnetic field 50 which may be generated by one or more of the magnets 40, including a repulsive force generated based on the interaction of two or more of separate, respective magnetic fields 50 generated by separate, respective magnets of the lower magnet 42, the middle magnet 46, and the upper magnet 44. The lower magnet 42 may use the repulsive force of the magnetic field(s) 50 to allow the dressing board 36 to be in contact with one or more grinding tips 26. The middle magnet 46 may include a permanent magnet. The lower magnet 42 and the middle magnet 46 may be arranged such that the same polarities are close to each other in a vertical view. When the lower magnet 42 has an N pole and an S pole above the N pole, the middle magnet 46 may have an N pole and an S pole below the N pole. When the N pole of the lower magnet 42 is provided on the S pole, the N pole of the middle magnet 46 may be provided below the S pole. The lower magnet 42 may adjust the magnitude of the repulsive force with the middle magnet 46 using an external power supply voltage (e.g., electrical power supply to the lower magnet 42 that may be controlled and/or adjusted in magnitude and/or frequency by the controller 90). The lower magnet 42 may adjust the frictional force and/or compression force between the dressing board 36 and the grinding tips 26.

The middle magnet 46 and the upper magnet 44 may buffer the vertical movement of the dressing board 36 based on the repulsive force of the magnetic field(s) 50. The grinding tips 26 may be in contact with the dressing board 36 by rotation of the grinding shaft 22 and grinding wheel 24. The dressing board 36 may move in a vertical direction whenever the dressing board 36 is in contact with and separates the grinding tips 26. The middle magnet 46 and the upper magnet 44 may use the repulsive force of the magnetic field(s) 50 to buffer the vertical movement of the dressing board 36, thereby increasing the dressing efficiency, thereby improving grinding performance and/or grinding efficiency of the grinding apparatus 100 with regard to grinding the substrate W.

A middle guiding part 41 of the internal guiding parts 38 may be provided between an outer wall of the middle magnet 46 and the inner sidewall of the external guiding part 32. The middle guiding part 41 may be provided between the lower guiding part 37 and the upper guiding part 39 in a vertical view. The middle guiding part 41 may be coupled to the middle magnet 46 to remove or prevent horizontal movement of the middle magnet 46.

A method of manufacturing a semiconductor device using the grinding apparatus 100 of the inventive concepts configured as described above will be described as follows. The methods as described herein, including one or more (or all) of the operations of the method may be controlled and/or implemented by on the controller 90 of the grinding apparatus, for example based on processing circuitry of the controller 90 executing a stored program of instructions (e.g., based on a processor of the processing circuitry executing a program of instructions that is stored on a memory of the processing circuitry).

Figure 4:
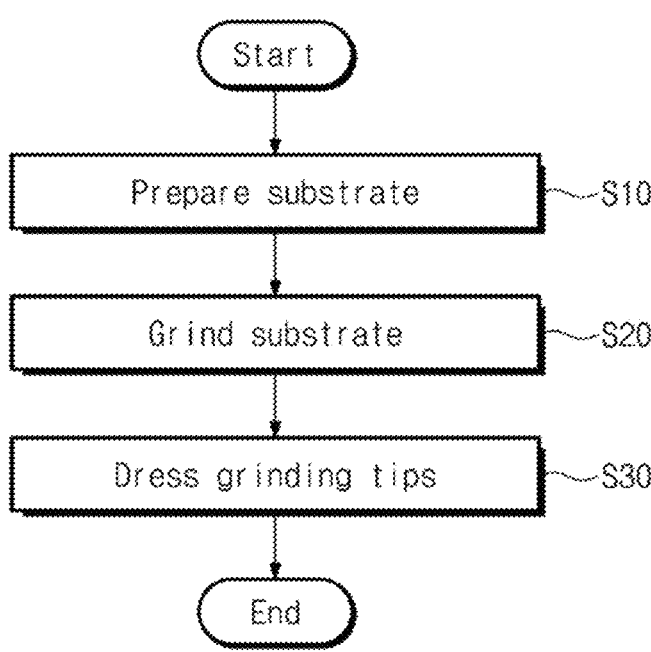
FIG. 4 is a flowchart illustrating a method of manufacturing a semiconductor device according to some example embodiments of the inventive concepts.

FIG. 4 illustrates a method of manufacturing a semiconductor device according to some example embodiments of the inventive concepts.

Referring to FIGS. 1 and 4, the substrate W is prepared in S10. The substrate W may have the pattern layer 16 and the rear thin film layer 18. The pattern layer 16 may be formed on the upper surface of the substrate W. The pattern layer 16 may include a memory device, a thin film transistor, a resistor, a capacitor, a metal wiring, and an interlayer insulating layer formed through a plurality of unit processes. The rear thin film layer 18 may be formed on the lower surface of the substrate W. The rear thin film layer 18 may include a dielectric layer of silicon oxide or silicon nitride, but the inventive concepts are not limited thereto. In some example embodiments, the preparing of the substrate W may be controlled by the controller 90 or another controller (including processing circuitry as described herein) controlling one or more manufacturing devices to cause the substrate W to be prepared.

The substrate W may be provided on the chuck table 14 of the grinding apparatus 100 by a robot arm or a transfer arm. The robot arm or the transfer arm may be controlled by the controller 90 or another controller (including processing circuitry as described herein) to cause the substrate W to be provided (e.g., placed) on the chuck table 14. The upper surface of the substrate W may be disposed below the lower surface thereof. The pattern layer 16 may be in contact with a top surface of the chuck table 14. The chuck table 14 may rotate the substrate W in an azimuth direction.

Then, the grinding unit 20 of the grinding apparatus 100 grinds the substrate W in S20. According to some example embodiments, the grinding unit 20 may grind the rear thin film layer 18 of the substrate W. The grinding tips 26 may grind the rear thin film layer 18 by rotation of the grinding wheel 24.

Referring to FIGS. 3 and 4, the dressing unit 30 dresses the grinding tips 26 of the grinding unit 20 in S30. The dressing unit 30 may include the unit arm 31, the external guiding part 32, the driving parts 34, the dressing board 36, the internal guiding parts 38, and the magnets 40. The unit arm 31 may support the external guiding part 32, the driving parts 34, the dressing board 36, the internal guiding parts 38, and the magnets 40. The external guiding part 32 may be provided on one side of the unit arm 31. The driving parts 34 may include the vertical driving part 33 and the horizontal driving part 35. The vertical driving part 33 and the horizontal driving part 35 may be disposed inside and outside the external guiding part 32. The vertical driving part 33 may move the magnets 40 and the dressing board 36 in a vertical direction. The horizontal driving part 35 may move the external guiding part 32 in a horizontal direction. The internal guiding parts 38 may be provided between the outer sidewalls of the magnets 40 and the inner sidewall of the external guiding part 32. The magnets 40 may include the lower magnet 42, the upper magnet 44, and the middle magnet 46. The lower magnet 42 and the vertical driving part 33 may move the dressing board 36 and perform dressing of the grinding tips 26 by the dressing board 36. The dressing efficiency of the grinding tips 26 may be determined by (e.g., may be based upon) loading force of the dressing board 36.

Figure 5:
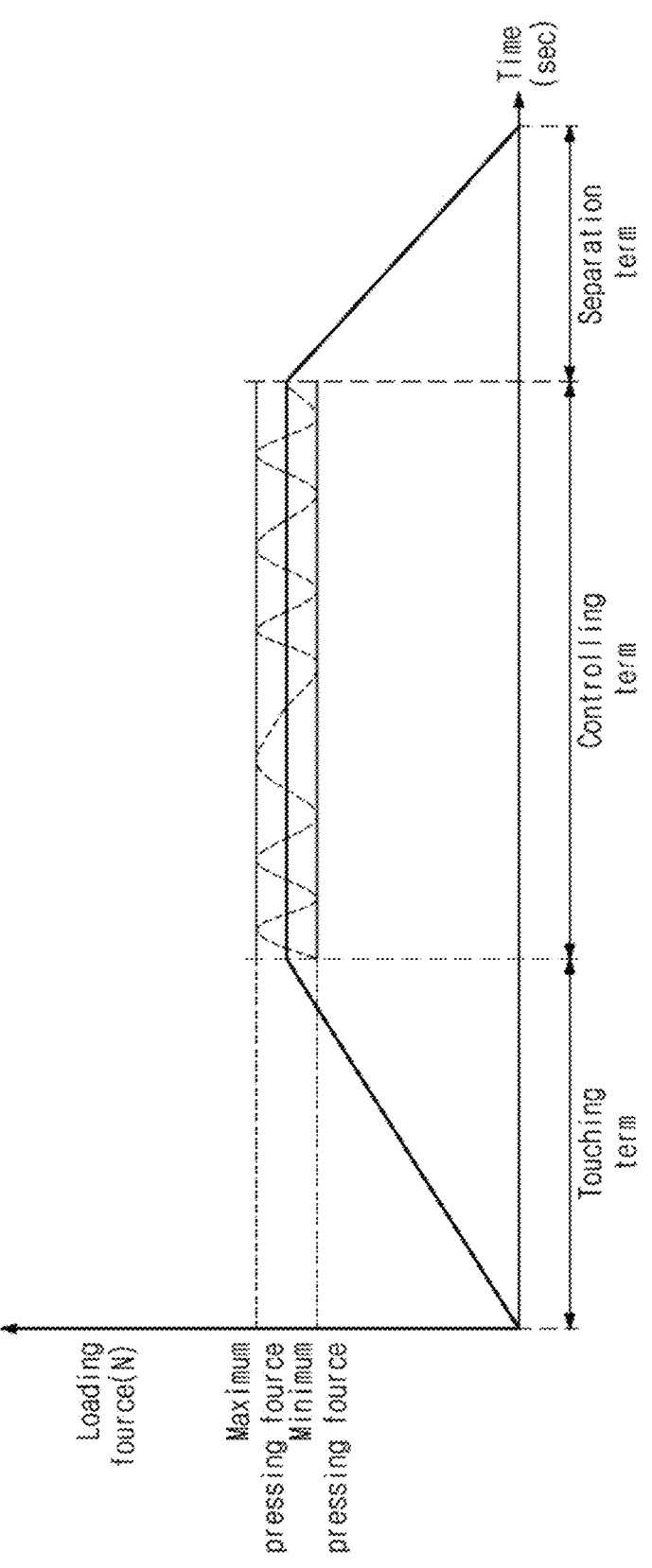
FIG. 5 is a graph illustrating loading force of a dressing board of FIG. 1 according to some example embodiments of the inventive concepts.

FIG. 5 shows loading force of the dressing board 36 of FIG. 1 according to some example embodiments of the inventive concepts.

Referring to FIG. 5, during a touching term, the loading force of the dressing board 36 may gradually increase. The vertical driving part 33 may lift the magnets 40 and the dressing board 36 to allow the dressing board 36 to be in contact with the grinding tips 26. The frictional force and/or compression force of the dressing board 36 and the grinding tips 26 may increase.

During a controlling term, the lower magnet 42 may adjust the strength of the magnetic field 50 generated thereby and thus the loading force of the dressing board 36 (which may be based on the repulsive force that is based on the interaction of the magnetic field 50 generated by the lower magnet 42 with a magnetic field generated by another magnet such as the upper magnet 44) may be controlled to the maximum pressing force and the minimum pressing force. The lower magnet 42 may precisely control a height of the dressing board 36, thereby improving the dressing efficiency, thereby improving the grinding and/or dressing performance of the grinding apparatus 100.

During a separation term, the loading force of the dressing board 36 may gradually decrease. The magnets 40 and the dressing board 36 may descent using the vertical driving part 33 and the dressing board 36 may be separated from the grinding tips 26.

When the grinding process and/or the dressing process of the rear thin film layer 18 on the substrate W is completed, the substrate W may be transferred to the outside of the grinding apparatus 100 (e.g., by a robot arm or transfer arm as described herein).

As described above, the grinding apparatus according to some example embodiments of the inventive concepts may use the dressing board separated from the driving parts by the repulsive force of the magnets, and thus may reduce, minimize, or prevent the damage due to the collision between the dressing unit and the grinding unit and may precisely control the dressing efficiency, thereby improving the performance and/or reliability of the grinding apparatus 100 with regard to performing grinding and/or dressing operations in relation to a method of manufacturing a semiconductor device that includes grinding a substrate using the grinding apparatus 100. Such improved performance and/or reliability of the grinding apparatus 100 may further cause the performance and/or reliability of semiconductor devices manufactured using the substrate that is ground by the grinding apparatus 100 to be improved based on the improved performance of the grinding apparatus 100, which may reduce the likelihood of defects in the substrate (e.g., insufficient and/or uneven grinding of the rear thin film layer 18) due to the grinding process.

While some example embodiments of the inventive concepts have been particularly shown and described, it will be understood by one of ordinary skill in the art that variations in form and detail may be made therein without departing from the spirit and scope of the attached claims.

What is claimed is:

1. A grinding apparatus, comprising:
   a chuck unit configured to receive a substrate;
   a grinding unit configured to be on a part of the chuck unit and further configured to grind the substrate; and
   a dressing unit configured to be under a part of the grinding unit adjacent to the chuck unit and to dress the grinding unit,
   wherein the dressing unit includes
   driving parts,
   a dressing board configured to be on the driving parts and to dress the grinding unit, and
   magnets between the dressing board and the driving parts, the magnets configured to generate one or more magnetic fields to float the dressing board from the driving parts using a repulsive force of the one or more magnetic fields,
   wherein the magnets include
   a lower magnet,
   an upper magnet on the lower magnet, and
   a middle magnet between the lower magnet and the upper magnet in a vertical direction, and
   wherein respective poles of each of the middle magnet, the upper magnet, and the lower magnet are aligned in the vertical direction.

2. The grinding apparatus of claim 1, wherein the lower magnet includes an electromagnet.

3. The grinding apparatus of claim 1, wherein the upper magnet includes a permanent magnet.

4. The grinding apparatus of claim 1, wherein the dressing unit further includes an external guiding part outside the lower magnet and the upper magnet.

5. The grinding apparatus of claim 4, wherein the external guiding part has a U-shape.

6. The grinding apparatus of claim 4, further comprising internal guiding parts between the external guiding part and the magnets.

7. The grinding apparatus of claim 6, wherein the internal guiding parts include:
   a lower guiding part between the external guiding part and the lower magnet; and
   an upper guiding part between an inner sidewall of the external guiding part and an outer sidewall of the upper magnet.

8. The grinding apparatus of claim 7, wherein the internal guiding parts further include a middle guiding part between the lower guiding part and the upper guiding part, the middle guiding part between the inner sidewall of the external guiding part and an outer sidewall of the middle magnet.

9. The grinding apparatus of claim 4, wherein the driving parts include:
   a vertical driving part in a lower part of the external guiding part; and
   a horizontal driving part on an outer of the lower part of the external guiding part.

10. A grinding apparatus, comprising:
   a chuck unit including a chuck table configured to receive a substrate;
   a grinding unit including a grinding wheel on the chuck table and grinding tips between the grinding wheel and the chuck table; and
   a dressing unit adjacent to the chuck table and configured to dress the grinding tips,
   wherein the dressing unit includes
   an external guiding part,
   driving parts,
   a dressing board on the driving parts, the dressing board configured to dress the grinding tips, and
   magnets, including
   a lower magnet in the external guiding part between the dressing board and the driving parts,
   an upper magnet in the external guiding part between the lower magnet and the dressing board, and
   a middle magnet between the lower magnet and the upper magnet in a vertical direction, and
   wherein respective poles of each of the middle magnet, the upper magnet, and the lower magnet are aligned in the vertical direction.

11. The grinding apparatus of claim 10, further comprising internal guiding parts including
   a lower guiding part between an inner sidewall of the external guiding part and an outer sidewall of the lower magnet, and
   an upper guiding part on the lower guiding part and between the inner sidewall of the external guiding part and an outer sidewall of the upper magnet.

12. The grinding apparatus of claim 11, wherein the internal guiding parts further include a middle guiding part between the inner sidewall of the external guiding part and an outer sidewall of the middle magnet.

13. The grinding apparatus of claim 11, wherein the driving parts include a vertical driving part in the external guiding part under the lower magnet, the vertical driving part configured to elevate the lower magnet.

14. The grinding apparatus of claim 13, wherein the driving parts further include a horizontal driving part on one side of the external guiding part, the horizontal driving part configured to move the external guiding part.

* * * * *